(12) United States Patent
Schubert et al.

(10) Patent No.: US 9,326,338 B2
(45) Date of Patent: Apr. 26, 2016

(54) MULTI-JUNCTION SOLID STATE TRANSDUCER DEVICES FOR DIRECT AC POWER AND ASSOCIATED SYSTEMS AND METHODS

(71) Applicant: Micron Technology, Inc., Boise, ID (US)

(72) Inventors: Martin F. Schubert, Boise, ID (US); Vladimir Odnoblyudov, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 192 days.

(21) Appl. No.: 13/923,647

(22) Filed: Jun. 21, 2013

(65) Prior Publication Data

US 2014/0375212 A1  Dec. 25, 2014

(51) Int. Cl.
| | |
|---|---|
| *H01L 21/24* | (2006.01) |
| *H05B 33/08* | (2006.01) |
| *H01L 29/73* | (2006.01) |
| *H01L 27/15* | (2006.01) |

(52) U.S. Cl.
CPC ............ *H05B 33/0827* (2013.01); *H01L 29/73* (2013.01); *H01L 27/153* (2013.01)

(58) Field of Classification Search
USPC ............... 257/44, 79, 81, 85, 98–103, 120
See application file for complete search history.

(56) References Cited

U.S. PATENT DOCUMENTS

| | | | | |
|---|---|---|---|---|
| 6,498,355 B1 * | 12/2002 | Harrah | ................ | H01L 25/0753 257/676 |
| 8,400,064 B2 * | 3/2013 | Wei | ....................... | H05B 33/083 315/122 |
| 8,759,847 B2 * | 6/2014 | Xu | ....................... | H01L 25/0753 257/40 |
| 2008/0211416 A1 * | 9/2008 | Negley | .................... | H01L 27/15 315/193 |
| 2012/0146066 A1 * | 6/2012 | Tischler | ................ | F21V 29/773 257/89 |
| 2013/0026924 A1 * | 1/2013 | Jong | .................. | H05B 33/0818 315/113 |
| 2014/0225514 A1 * | 8/2014 | Pickard | ............. | H05B 33/0857 315/152 |
| 2014/0369045 A1 * | 12/2014 | Yu | ............................. | F21K 9/00 362/249.02 |

* cited by examiner

*Primary Examiner* — Tuyet Vo
(74) *Attorney, Agent, or Firm* — Perkins Coie LLP

(57) ABSTRACT

Multi-junction solid-state transducer (SST) devices and associated systems and methods are disclosed herein. In several embodiments, for example, an SST system can include a first multi-junction SST chain having a first drive voltage, a first P-contact, and a first N-contact, and a second multi-junction SST chain having a second drive voltage, a second P-contact, and a second N-contact. The first and second multi-junction SST chains can be configured to be activated independently of each other. The SST system can further include a driver operably coupled to the first and second P- and N-contacts. The driver can be configured to activate the first multi-junction SST chain when voltage input is at least equal to the first drive voltage. When absolute voltage increases a predetermined voltage level, the driver can be configured to activate the second multi-junction SST chain or the first and second multi-junction SST chains.

15 Claims, 4 Drawing Sheets

US 9,326,338 B2

MULTI-JUNCTION SOLID STATE TRANSDUCER DEVICES FOR DIRECT AC POWER AND ASSOCIATED SYSTEMS AND METHODS

TECHNICAL FIELD

The present technology is related to solid state transducer ("SST") devices and methods of manufacturing SST devices. In particular, the present technology is related to multi-junction SST devices for use with alternating current ("AC") power and associated systems and methods.

BACKGROUND

Mobile phones, personal digital assistants ("PDAs"), digital cameras, MP3 players, and other electronic devices utilize light-emitting diodes ("LEDs"), organic light-emitting diodes ("OLEDs"), polymer light-emitting diodes ("PLEDs"), and other solid-state transducer devices for backlighting. Solid-state transducer devices are also used for signage, indoor lighting, outdoor lighting, and other types of general illumination. FIG. 1A is a cross-sectional view of a conventional LED die 10a with lateral contacts. As shown in FIG. 1A, the LED die 10a includes a substrate 20 carrying an LED structure 11 having an active region 14, e.g., containing gallium nitride/indium gallium nitride (GaN/InGaN) multiple quantum wells ("MQWs"), positioned between N-type GaN 15 and P-type GaN 16. The LED die 10a also includes a first contact 17 on the P-type GaN 16 and a second contact 19 on the N-type GaN 15. The first contact 17 typically includes a transparent and conductive material (e.g., indium tin oxide ("ITO")) to allow light to escape from the LED structure 11.

FIG. 1B is a cross-sectional view of another conventional LED die 10b in which the first and second contacts 17 and 19 are opposite each other, e.g., in a vertical rather than lateral configuration. During formation of the LED die 10b, the N-type GaN 15, the active region 14 and the P-type GaN 16 are stacked sequentially on a growth substrate (not shown), similar to the substrate 20 shown in FIG. 1A. The first contact 17 is formed on the P-type GaN 16, and a carrier substrate 21 is attached to the first contact 17. The growth substrate is then removed and the second contact 19 is formed on the N-type GaN 15. The structure is then inverted to produce the orientation shown in FIG. 1B.

Many LED devices (e.g., including the LED dies 10a and 10b of FIGS. 1A and 1B) are operated using AC power rather than direct current ("DC") power because it reduces the complexity of the power supply electronics and, accordingly, can reduce the overall cost of the device (e.g., by removing the AC/DC converter). Typical AC-driven LED devices include LED dies (e.g., the LED dies 10a and 10b) coupled together in series and connected directly to an AC power supply. This configuration, known as "basic direct AC", has a low overall efficiency because the individual LEDs produce virtually no light except for when the AC voltage is near its peak value. That is, the LEDs only operate when there is sufficient voltage to power all of the LEDs in the device. Other AC-driven LED devices include a variable length chain of LED dies, in which one or more LEDs are switched on as the voltage increases. This configuration, known as "multi-tap direct AC", provides greater overall power utilization than basic direct AC systems because at least a portion of the LEDs are driven at lower currents.

Both the basic direct and multi-tap LED device arrangements typically include a large number of LED dies. However, for certain applications such large numbers of LED dies render the use of AC power infeasible. For example, the total emitter area (i.e., the area of a device provided for the light emitting source) in spot lighting is typically constrained to such a small area relative to the overall optics that often times only a single LED die is used. Achieving the same lumen density with the assembly of LED dies used in conventional AC power approaches would therefore be unfeasible.

DETAILED DESCRIPTION

Specific details of several embodiments of multi-junction SST devices for use with AC power sources and associated systems and methods are described below. The term "SST" generally refers to solid-state transducers that include a semiconductor material as the active medium to convert electrical energy into electromagnetic radiation in the visible, ultraviolet, infrared, and/or other spectra. For example, SSTs include solid-state light emitters (e.g., LEDs, laser diodes, etc.) and/or other sources of emission other than electrical filaments, plasmas, or gases. SSTs can also include solid-state devices that convert electromagnetic radiation into electricity. A person skilled in the relevant art will also understand that the technology may have additional embodiments, and that the technology may be practiced without several of the details of the embodiments described below with reference to FIGS. 2A-5.

Figure 1A:
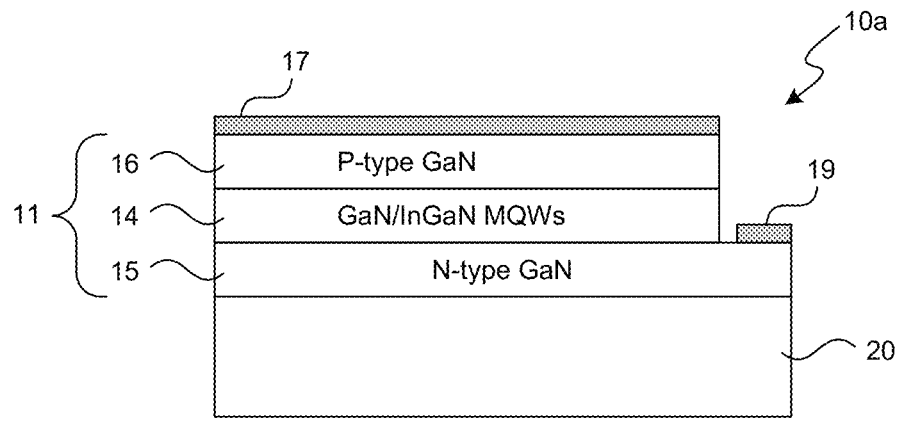
FIG. 1A is a partially schematic cross-sectional diagram of an LED die configured in accordance with the prior art.
Figure 1B:
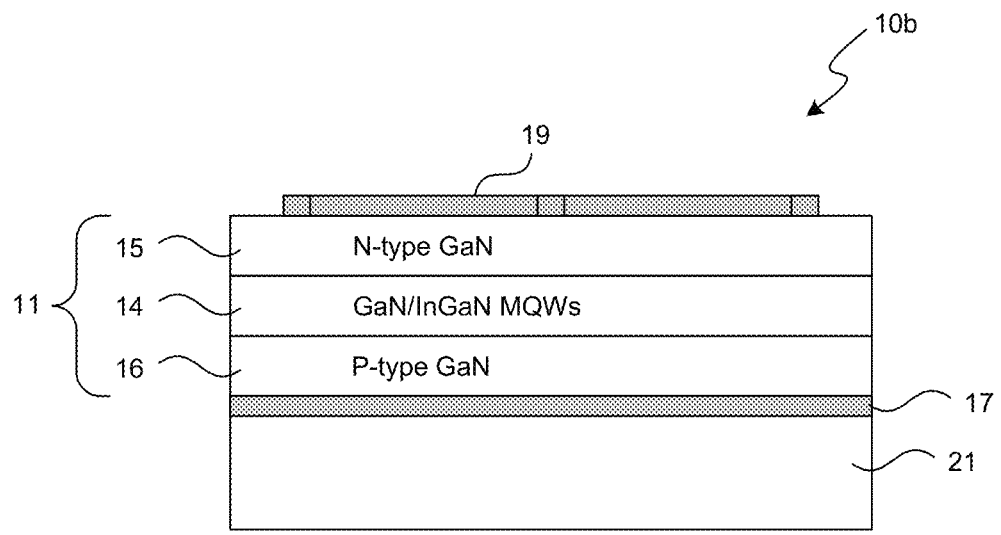
FIG. 1B is a partially schematic cross-sectional diagram of an LED die configured in accordance with another embodiment of the prior art.
Figure 2A:
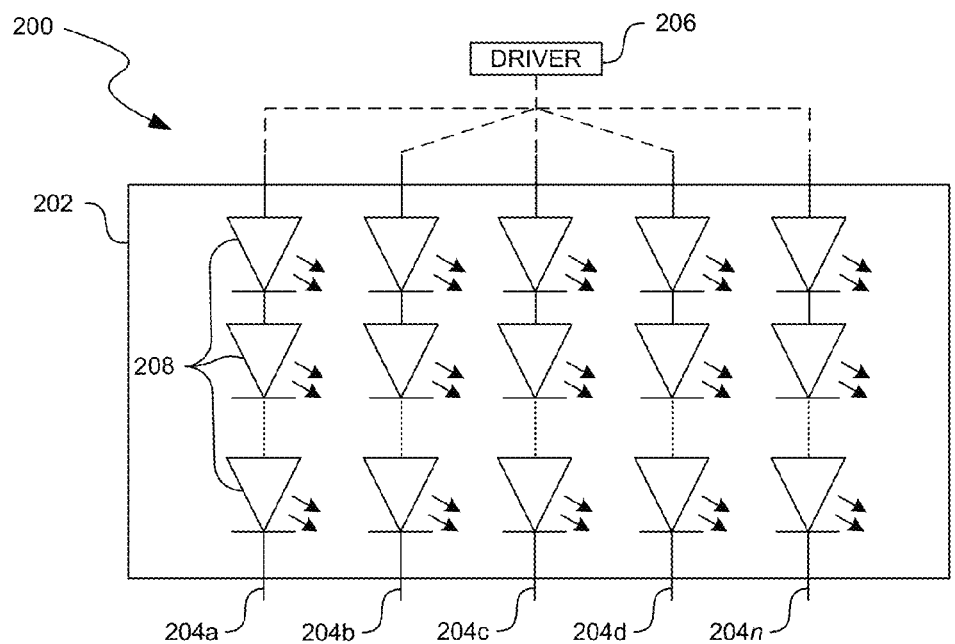
FIG. 2A is a partially schematic circuit diagram of an SST system configured in accordance with embodiments of the present technology.

FIG. 2A is a partially schematic circuit diagram of an SST system 200 configured in accordance with embodiments of the present technology. The SST system 200 can include an SST device 202 having a plurality of multi-junction SST chains (identified individually as first through nth multi-junction SST chains 204a-204n, respectively, and referred to collectively as multi-junction SST chains 204 or chains 204) and a driver 206 operably coupled to the individual multi-junction SST chains 204. The driver 206 can be configured to drive each multi-junction SST chain 204 independently of the others depending on the input voltage received from a power source (not shown). For example, the driver 206 can be configured to activate or drive the first multi-junction SST chain 204a when voltage input is at least equal to the drive voltage of the first multi-junction SST chain 204a and, as voltage increases (e.g., as it would during a portion of a phase of an AC waveform), the driver 206 can be configured to activate additional and/or different chains 204 of the SST device 202. In other embodiments, the driver 206 can selectively activate one multi-junction SST chain at a time depending on the input voltage. In either embodiment, the driver 206 can be configured to control the SST device 202 such that the absolute voltage input at a given time is greater than the summation of the drive voltages of all the activated multi-junction SST chains 204.

The multi-junction SST chains 204 can be formed together as part of a single die to provide a small overall emissions area (e.g., as compared to multi-die devices). In the illustrated embodiment, the SST device 202 includes five multi-junction SST chains 204 on a single die. In other embodiments, the SST device 202 can include fewer than five or more than five multi-junction SST chains 204 on a single die. In other embodiments, the multi-junction SST chains 204 may be individually formed on separate dies.

Each multi-junction SST chain 204 can include two or more P-N junctions 208 (illustrated as LEDs) coupled together in series (e.g., as shown in FIG. 2A) or in parallel. The individual P-N junctions 208 can include a first semiconductor material, an active region, and a second semiconductor material stacked sequentially on one another and formed using metal organic chemical vapor deposition ("MOCVD"), molecular beam epitaxy ("MBE"), liquid phase epitaxy ("LPE"), hydride vapor phase epitaxy ("HVPE"), and/or other suitable epitaxial growth techniques known in the art. The first semiconductor material can include a P-type semiconductor material (e.g., a P-type gallium nitride ("P-GaN")), and the second semiconductor material can include an N-type semiconductor (e.g., an N-type gallium nitride ("N-GaN")). In selected embodiments, the first and second semiconductor materials can individually include at least one of gallium arsenide (GaAs), aluminum gallium arsenide (AlGaAs), gallium arsenide phosphide (GaAsP), gallium (III) phosphide (GaP), zinc selenide (ZnSe), boron nitride (BN), aluminum gallium nitride (AlGaN), and/or other suitable semiconductor materials. The active region can include a single quantum well ("SQW"), MQWs, and/or a bulk semiconductor material. The term "bulk semiconductor material" generally refers to a single grain semiconductor material (e.g., InGaN) with a thickness between approximately 10 nanometers and approximately 500 nanometers. In certain embodiments, the active region can include an InGaN SQW, GaN/InGaN MQWs, and/or an InGaN bulk material. In other embodiments, the active region can include aluminum gallium indium phosphide (AlGaInP), aluminum gallium indium nitride (AlGaInN), and/or other suitable materials or configurations. In various embodiments, the individual P-N junctions 208 can be configured to emit light in the visible spectrum (e.g., from about 390 nm to about 750 nm), in the infrared spectrum (e.g., from about 1050 nm to about 1550 nm), and/or in other suitable spectra. Further aspects of the manner in which the multi-junction SST chains 204 can be formed are set forth in U.S. patent application Ser. No. 13/210,249, which is incorporated herein by reference in its entirety.

Each P-N junction 208 can have a predefined drive voltage (i.e., the voltage required to illuminate or otherwise activate the P-N junction 208). When the P-N junctions 208 are coupled together in series, the corresponding multi-junction SST chain 204 can have a total drive voltage that is equal to the sum of the drive voltages of all the P-N junctions 208 in the multi-junction SST chain 204. For example, in certain embodiments the individual multi-junction SST chains 204 each have four P-N junctions 208, and each P-N junction has a drive voltage of about 3V, resulting in a 12V drive voltage for each multi-junction SST chain 204. In other embodiments, the multi-junction SST chains 204 can include different numbers of P-N junctions 208 and/or the individual P-N junctions 208 can have different drive voltages. In further embodiments, the individual multi-junction SST chains 204 in the SST device 202 can have different drive voltages. For example, the first multi-junction SST chain 204a can have a 12V drive voltage, the second multi-junction SST chain 204b can have a 24V drive voltage, and the other multi-junction SST chains 204 can have increasingly higher drive voltages.

Figure 2B:
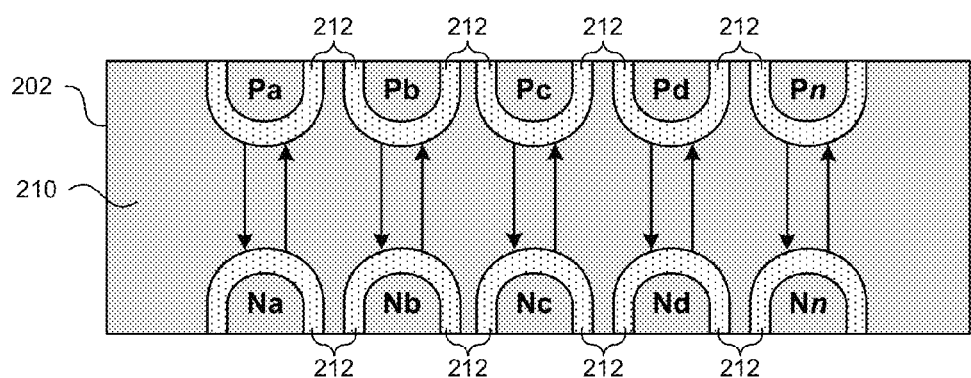
FIG. 2B is a partially schematic backside plan view illustrating a contact arrangement for an SST device configured in accordance with embodiments of the present technology.

The SST device 202 can include multiple terminals or contacts corresponding to the individual multi-junction SST chains 204 such that the driver 206 can selectively activate the individual multi-junction SST chains 204 independently of each other. FIG. 2B, for example, is a bottom view of the SST device 202 configured in accordance with one such contact arrangement. Each multi-junction SST chain 204 includes a P-contact (identified individually as first through nth P-contacts Pa-Pn, respectively, and referred to collectively as P-contacts P) and an N-contact (identified individually as first through nth N-contacts Na-Nn, respectively, and referred to collectively as N-contacts N). In certain embodiments, the P- and N-contacts can be accessible from the same side (e.g., the back side) of the SST device 202. As shown in FIG. 2B, for example, the P- and N-contacts can be defined by portions of an electrically conductive substrate 210 (e.g., plated onto the backside of the SST device 202), and electrically isolated from each other and the remaining portions of the conductive substrate 210 by isolators 212. For example, referring to FIGS. 2A and 2B together, the P-contact Pa can be electrically coupled to the P-type GaN of the first P-N junction 208 of the multi-junction SST chain 204a, and the N-type GaN of the last P-N junction 208 of the multi-junction SST chain 204a can be electrically coupled to the N-contact Na, with the intermediate P-N junctions 208 serially coupled therebetween. The remaining multi-junction SST chains 204b-204n can be electrically coupled to P-contacts Pb-Pn and N-contacts Nb-Nn, respectively. The isolators 212 can be formed by first creating two vias associated with each chain 204: one extending through the substrate 210 to the P-type GaN of the first P-N junction 208, and the other that extends through the substrate 210 to the N-type GaN of the last P-N junction 208. After the vias have been formed, an insulative material (e.g., a dielectric material) can be disposed in the vias to isolate the exposed P-type and N-type GaN materials from other portions of the SST device 202 and define the master contacts of each multi-junction SST chain 204. In this embodiment, the electrically conductive substrate 210 can also serve as a thermal pad to transfer heat away from the active regions of the multi-junction SST chains 204 and lower the overall operating temperature of the SST device 202. Further aspects of such plated backside contacts are described in U.S. patent application Ser. No. 13/218,289, which is incorporated by reference herein in its entirety. In other embodiments, the multi-junction SST chains 204 can have other suitable contacts that can electrically connect the individual multi-junction SST chains 204 to the driver 206.

The driver 206 can be electrically coupled to the individual P- and N-contacts with separate outputs (e.g., lines or channels) corresponding to each multi-junction SST chain 204. For example, the driver 206 can be electrically coupled to the P- and N-contacts using backside bonding techniques, wire bonds, solder bumps, a flip chip arrangement, through-substrate vias, and/or other suitable connection means for electrically coupling a die to a driver. In operation, current flows from the individual P-contacts to the corresponding N-contacts when the polarity of the phase of the AC waveform is positive. In certain embodiments, the driver 206 can be configured to reverse the polarity of one of the phases of the AC voltage (e.g., from negative to positive) such that current always has the same polarity. For example, the negative polarity phase of the AC waveform can be reversed to be positive such that current flows from the P-contacts to the corresponding N-contacts regardless of the phase of the input voltage, and allows the SST device 202 to operate when the phase of the AC voltage is negative. In other embodiments, the SST device 202 can further include separate multi-junction SST chains oriented in the opposite direction of those shown in FIG. 2A, such that current can flow in the opposite direction (e.g., as indicated by the arrows of FIG. 2B) when the polarity of the phase of the AC voltage changes. For example, in embodiments operating under AC power, the driver 206 can be configured to direct current in a first direction when the phase of the AC voltage is positive, and in a second direction opposite the first direction when the phase of the AC voltage is negative.

The driver 206 can be a multi-tap direct-AC driver that selectively activates the individual multi-junction SST chains 204 (e.g., via the individual P- and N-contacts) depending on the power input (e.g., using a controller integrated with the driver 206). For example, the first multi-junction SST chain 204a can be illuminated or otherwise activated at lower input voltages (e.g., once the voltage supplied is at lest equal to the drive voltage of the first multi-junction SST chain 204a). As the input voltage increases to a predetermined voltage level (e.g., corresponding to the drive voltage associated with the sum of the first and second multi-junction SST chains 204a and 204b), the first and second multi-junction SST chains 204a and 204b can be illuminated together. Additional multi-junction SST chains 204 can be powered on and added to the first and second multi-junction chains 204a and 204b as the voltage increases until the maximum voltage is reached and all multi-junction SST chains 204 are activated.

In other embodiments, each multi-junction SST chain 204 may have a different drive voltage, and the driver 206 can selectively activate one or more individual multi-junction SST chains 204 based on the varying input voltage. For example, the first through nth multi-junction SST chains 204a-n can each have different drive voltages (e.g., incrementally increasing drive voltages than the proceeding multi-junction SST chain 204). As the input voltage increases and decreases (e.g., in a sinusoidal manner), the driver 206 can selectively activate and deactivate different multi-junction SST chains 204 based on the predetermined voltage level required to activate each multi-junction SST chain 204. Both configurations of the SST system 200 enable the SST device 202 to directly connect to AC power, and do so while utilizing the varying levels of available power. For example, unlike conventional systems that only activate an SST device when the voltage is sufficient to power all the SSTs in the system, the SST system 200 can operate at least a portion of the SST device 202 (e.g., one or more multi-junction SST chains 204) at lower voltage levels. Therefore, the SST device 202 provides a more efficient power use than conventional AC systems.

In addition, as shown in FIG. 2A, the plurality of multi-junction SST chains 204 can be formed as part of a single die, and therefore take up much less area than a plurality of individual SST dies coupled to the driver 206. The plurality of P-N junctions 208 in each multi-junction SST chain 204 also provide greater overall emissions (e.g., luminous flux) than a single P-N junction can provide. Accordingly, one or more of the multi-junction SST chains 204 can provide greater overall emissions from a smaller area than a conventional single P-N junction SST dies. This more compact design allows the SST device 202 to be used in systems with tight space constraints for the emitter (e.g., spot lighting), while still providing a high overall output (e.g., luminous flux).

Figure 3:
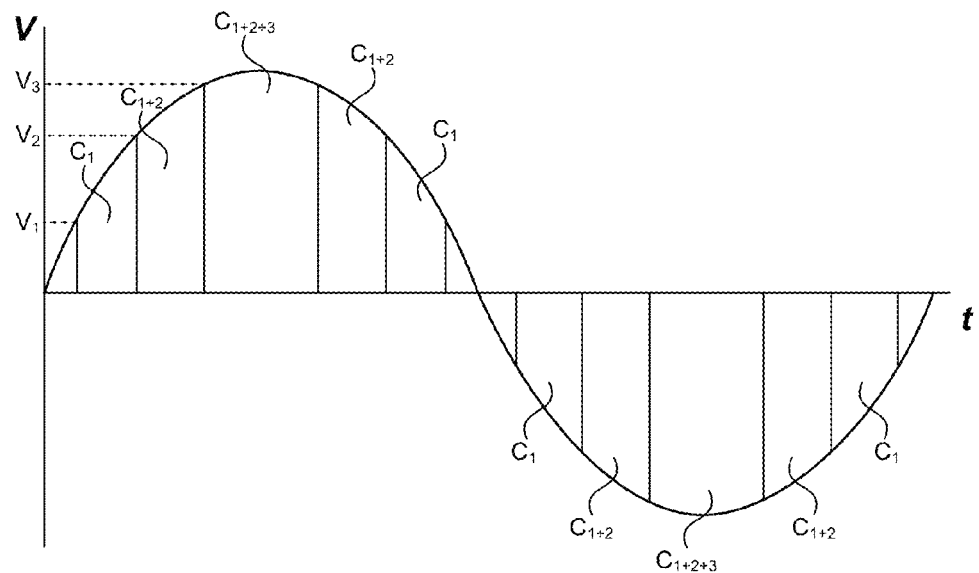
FIG. 3 is a time versus voltage graph illustrating an AC power curve as it relates to an SST device configured in accordance with embodiments of the present technology.
Figure 4:
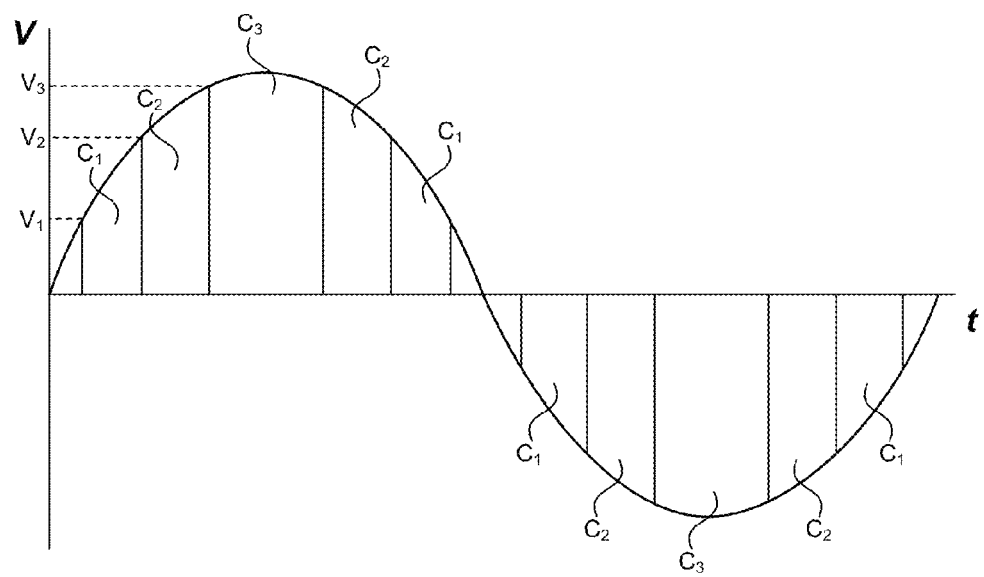
FIG. 4 is a time versus voltage graph illustrating an AC power curve as it relates to an SST device configured in accordance with other embodiments of the present technology.

FIGS. 3 and 4 are time versus voltage plots illustrating sinusoidal AC power curves as they relate to an SST device (e.g., the SST device 202 of FIGS. 2A and 2B) configured in accordance with embodiments of the present technology. For illustrative purposes, the embodiments shown in FIGS. 3 and 4 are described with reference to an SST device with three multi-junction SST chains (e.g., configured similar to the multi-junction SST chains 204 of FIG. 2A), but in other embodiments SST devices can include two or more than three multi-junction SST chains. In the embodiment illustrated in FIG. 3, a driver (e.g., the driver 206 of FIG. 2A) is configured to serially activate multi-junction SST chains as the absolute input voltage increases, and serially deactivate multi-junction SST chains as the absolute input voltage decreases. For example, the driver can activate a first chain after the input voltage reaches a first predetermined voltage level $V_1$ (e.g., 12V) corresponding to the voltage necessary to drive the first chain, and the first chain can remain active as the input voltage increases (e.g., as indicated by the section of the graph labeled $C_1$). When the input voltage reaches a second predetermined voltage level $V_2$ (e.g., 24V) corresponding to the voltage necessary to drive the first chain and a second chain together, the first and second chains can be activated (e.g., as indicated by the section of the graph labeled $C_{1+2}$). Similarly, a third chain can be activated once the input voltage is at least equal to a third predetermined voltage level $V_3$ (e.g., 48V) corresponding to the voltage necessary to simultaneously drive the first through third chains (e.g., as indicated by the section of the graph labeled $C_{1+2+3}$). The individual chains can have the same drive voltages, or the drive voltages may differ between chains. In embodiments including additional chains, the driver can be configured to activate an increasing number of chains until all the chains are activated or the maximum input voltage is reached.

As further shown in FIG. 3, the third chain can be deactivated when the input voltage decreases below the third predetermined voltage level $V_3$, and the second chain can be deactivated when the input voltage decreases below the second predetermined voltage level $V_2$. As the power curve decreases further and the input voltage becomes negative, the driver can be configured to reverse the polarity of the input voltage and activate the chains in a similar fashion as when the voltage is positive (e.g., activating an increasing number of chains as the absolute voltage increases). In other embodiments, the SST device may be configured to operate in the reverse direction when the input voltage is negative to utilize the negative power input without requiring the driver to reverse polarity.

In the embodiment illustrated in FIG. 4, each multi-junction SST chain has a different drive voltage (e.g., 6V, 12V, 24V, 40V, 48V, 80V, etc.), and the SST device is configured to activate one chain at a time depending upon the input voltage. In this embodiment, the first through third predetermined voltage levels $V_1$-$V_3$ corresponds to the drive voltage of the first through third chains, respectively. Accordingly, the driver can be configured to activate the first chain alone when the absolute input voltage is at least equal to the first predetermined voltage level (e.g., as indicated by the section of the graph labeled $C_1$). Once the absolute input voltage increases to the second voltage level $V_2$, the driver can deactivate the first chain and activate the second chain (e.g., as indicated by the section of the graph labeled $C_2$). Similarly, when the absolute input voltage is at least equal to the third predetermined voltage level $V_3$, the driver can deactivate the second chain and activate the third chain (e.g., as indicated by the section of the graph labeled $C_3$). Accordingly, as absolute input voltage decreases, the chains with higher drive voltages can be deactivated and the chains with lesser drive voltages can be activated. Both embodiments shown in FIGS. 3 and 4 can be used directly with AC power sources to utilize the available power as it increases and decreases, and therefore provide for a more efficient system than conventional direct-AC system.

In various embodiments, the SST devices described with reference to FIGS. 3 and 4 can also be configured for use with DC power. For example, the SST devices can be connected to a DC power source (e.g., a driver having an AC/DC converter) having a specific voltage (e.g., 50V, 80V, 100V, etc.), and the driver can selectively activate one or more of the chains based on the voltage of the power source. For example, the driver can activate the chain or combination of chains with the highest drive voltage that can be activated by the input voltage supplied by the DC power source. If a different DC power source with a different voltage is connected to the SST systems, the driver can selectively activate one or more chains with complimentary drive voltages. Accordingly, the SST devices described with respect to FIGS. 3 and 4 may be compatible for use with various different DC power sources.

Figure 5:
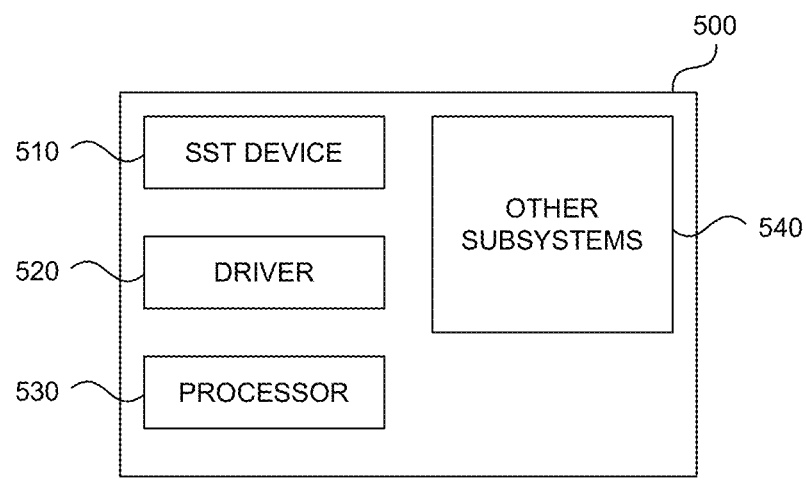
FIG. 5 is a schematic view of a system that includes an SST device configured in accordance with embodiments of the present technology.

Any one of the SST devices described above with reference to FIGS. 2A-4 can be incorporated into any of a myriad of larger and/or more complex systems, a representative example of which is system 500 shown schematically in FIG. 5. The system 500 can include one or more SST devices 510, a driver 520, a processor 530, and/or other subsystems or components 540. The resulting system 500 can perform any of a wide variety of functions, such as backlighting, general illumination, power generations, sensors, and/or other suitable functions. Accordingly, representative systems 500 can include, without limitation, hand-held devices (e.g., mobile phones, tablets, digital readers, and digital audio players), lasers, photovoltaic cells, remote controls, computers, and appliances. Components of the system 500 may be housed in a single unit or distributed over multiple, interconnected units (e.g., through a communications network). The components of the system 500 can also include local and/or remote memory storage devices, and any of a wide variety of computer readable media.

From the foregoing, it will be appreciated that specific embodiments of the technology have been described herein for purposes of illustration, but that various modifications may be made without deviating from the disclosure. For example, the SST device 202 illustrated in FIG. 2A includes an equal number of P-N junctions 208 in each multi-junction SST chain 204. In other embodiments, however, the individual multi-junction SST chains 204 of an SST device may include different numbers of P-N junctions. Certain aspects of the new technology described in the context of particular embodiments may be combined or eliminated in other embodiments. Additionally, while advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A solid-state transducer (SST) system, comprising:
a first multi-junction SST chain having a first drive voltage, a first P-contact, and a first N-contact; and
a second multi-junction SST chain having a second drive voltage, a second P-contact, and a second N-contact, wherein the first and second multi-junction SST chains are configured to be driven independently of each other, and wherein the first and second multi-junction SST chains are part of a single die.

2. The SST system of claim 1, further comprising a driver configured to activate the first multi-junction SST chain when absolute voltage input is at least equal to the first drive voltage and activate the second multi-junction SST chain or the first and second multi-junction SST chains when absolute voltage input increases to a predetermined voltage level.

3. The SST system of claim 2 wherein the first drive voltage is less than the second drive voltage, and wherein the driver is configured to activate the second multi-junction SST chain alone when absolute voltage input is at least equal to the second drive voltage.

4. The SST system of claim 2 wherein the driver is configured to activate the first and second multi-junction SST chains when absolute voltage input is at least equal to a summation of the first and second drive voltages.

5. The SST system of claim 2 wherein the driver is an AC driver, and wherein the AC driver is configured to reverse polarity of voltage phase of an AC waveform.

6. The SST system of claim 2 wherein the driver is an AC driver, and wherein the SST system further comprises:
a third multi-junction SST chain and a fourth multi-junction SST chain operably coupled to the AC driver, wherein the third and fourth multi-junction SST chains are oriented in an opposite direction to the first and second SST chains; and
wherein the AC driver is configured to activate the first and second multi-junction SST chains in a first direction when a phase of an AC waveform is positive and activate the third and fourth multi-junction SST chains in a second direction opposite the first direction when the phase of the AC waveform is negative.

7. A lighting system, comprising:
a multi-junction light emitting diode (LED) die including a plurality of multi-junction SST chains, wherein each multi-junction SST chain has a P-contact, an N-contact, and a drive voltage, and wherein the first and second multi-junction SST chains are configured to be driven independently of each other; and
a driver independently coupled to the individual P- and N-contacts, wherein the driver is configured to drive at least one multi-junction SST chain when voltage input is at least equal to a first predetermined voltage level and drive a different and/or additional multi-junction SST chain when absolute voltage input increases to a second predetermined voltage level.

8. The lighting system of claim 7 wherein the driver is configured to serially activate the multi-junction SST chains as absolute voltage input increases, and wherein the driver is configured to serially deactivate the multi-junction SST chains as absolute voltage input decreases.

9. The lighting system of claim 7 wherein the driver is configured to drive one multi-junction SST chain at a time depending on the voltage input.

10. A solid-state transducer (SST) die, comprising:
a first multi-junction SST chain having a first drive voltage, a first P-contact, and a first N-contact, wherein the first P- and N-contacts are configured to connect to a first output of an AC driver; and
a second multi-junction SST chain having a second drive voltage, a second P-contact, and a second N-contact, wherein the second P- and N-contacts are configured to connect to a second output of the AC driver, and wherein the first and second multi-junction SST chains are configured to activated independently of each other.

11. The SST die of claim 10 wherein the first multi-junction SST chain is configured to be activated when absolute voltage input is at least equal to the first drive voltage, and wherein the second multi-junction SST chain or the first and second multi-junction SST chains are configured to be activated when absolute voltage input increases to a predetermined voltage level.

12. The SST die of claim 10 wherein the first and second multi-junction SST chains are two of a plurality of multi-junction SST chains, and wherein the drive voltage of each multi-junction SST chain increases from the first multi-junction SST chain to an $n^{th}$ multi-junction SST chain.

13. The SST die of claim 10 wherein the first and second multi-junction SST chains are two of a plurality of multi-junction SST chains, and wherein the drive voltages of the individual multi-junction SST chains are substantially equal.

14. The SST die of claim 10, further comprising a third multi-junction SST chain having a third drive voltage, a third P-contact, and a third N-contact, wherein the third P- and N-contacts are configured to connect to a third output of the AC driver, and wherein the third multi-junction SST chain is oriented in an opposite direction to the first and second SST chains.

15. A method of operating a solid-state transducer (SST) system, the method comprising:
receiving a voltage at a driver;
activating a first multi-junction SST chain of a plurality of multi-junction SST chains when absolute voltage input is at least equal to a first predetermined voltage level, wherein the first predetermined voltage level is at least equal to a drive voltage of the first multi-junction SST chain; and
activating a second multi-junction SST chain of P-N junctions of the plurality of multi-junction SST chains of P-N junctions when absolute voltage input is at a second predetermined voltage level, wherein the second predetermined voltage level is at least equal to a drive voltage of the second multi-junction SST chain, and wherein the second predetermined voltage level is higher than the first predetermined voltage level, and wherein the plurality of multi-junction SST chains define a single SST die.

* * * * *